United States Patent [19]

Moore et al.

[11] Patent Number: 5,325,365
[45] Date of Patent: Jun. 28, 1994

[54] IN A MEMORY EMULATION TEST APPARATUS, A METHOD OF AND SYSTEM FOR FAST FUNCTIONAL TESTING OF MEMORIES IN MICROPROCESSOR-BASED UNITS

[75] Inventors: Matthew P. Moore, Bellevue; Thomas P. Locke, Woodinville, both of Wash.

[73] Assignee: John Fluke Mfg. Co., Inc., Everett, Wash.

[21] Appl. No.: 771,642

[22] Filed: Oct. 4, 1991

[51] Int. Cl.⁵ .............................................. G06F 11/00
[52] U.S. Cl. ................................... 371/16.2; 371/16.1
[58] Field of Search .................... 371/16.2, 16.1, 22.4, 371/19; 395/500, 575

[56] References Cited

U.S. PATENT DOCUMENTS

| | | |
|---|---|---|
| 4,868,822 | 9/1989 | Scott et al. .................... 371/16 |
| 4,873,705 | 10/1989 | Johnson ............................. 371/21.2 |
| 4,989,207 | 1/1991 | Polstra .............................. 371/16.2 |
| 4,993,027 | 2/1991 | McGraw et al. .................. 371/16.2 |
| 5,068,852 | 11/1991 | Locke ............................... 371/16.2 |
| 5,136,590 | 8/1992 | Polstra et al. ..................... 371/16.2 |

*Primary Examiner*—Vincent P. Canney
*Attorney, Agent, or Firm*—George T. Noe

[57] ABSTRACT

A memory emulation test system is provided with a method of and system for fast functional testing of memories, such as boot ROMs, in microprocessor-based assemblies. The emulative test system includes a synchronization circuit which automatically re-arms itself and generates sync pulses on each and every UUT data access cycle to allow the UUT microprocessor to read every boot ROM memory location and collect data to be computed into a checksum or other signature to be compared with a predetermined signature representative of a correctly functioning and faultless boot ROM.

2 Claims, 2 Drawing Sheets

IN A MEMORY EMULATION TEST APPARATUS, A METHOD OF AND SYSTEM FOR FAST FUNCTIONAL TESTING OF MEMORIES IN MICROPROCESSOR-BASED UNITS

BACKGROUND OF THE INVENTION

The present invention relates generally to functional testing of memories, and in particular to a method of and system for fast functional testing of memories in microprocessor-based units using a memory-based emulative tester.

Emulative testers, so called because they emulate the behavior of microprocessor-kernel-related devices, are popular for functional testing and fault isolation in microprocessor-based boards or systems. Typically, the emulative tester is connected to a unit under test (UUT) at convenient locations, such as the microprocessor and memory sockets, and effectively takes control of the UUT as though it were part of the UUT's microprocessor kernel. An example of such an emulative tester is described in U.S. Pat. No. 4,868,822 issued to Marshall H. Scott et al., and assigned to John Fluke Mfg. Co., Inc.

U.S. Pat. No. 4,868,822 discloses an emulative tester that is plugged into vacated read-only memory (ROM) sockets on the UUT to allow the UUT's microprocessor to execute instructions contained in emulation memory within the tester. The removed ROMs, which contain the boot-up instructions for the UUT microprocessor, may be plugged into a ROM module associated with the tester so that a user may instruct the UUT microprocessor to access information from either emulation memory or the UUT's own boot ROMs. The emulative tester also includes a number of leads that connect to the UUT microprocessor for developing sync pulses and providing reset signals from the tester to the UUT microprocessor.

In the prior-art memory-based emulative testers, reading information from the UUT boot ROMs was carried out on a bus-cycle-by-bus-cycle basis. That is, the boot ROM was turned on for one specific bus cycle of interest, such as a "read" cycle, during which the UUT microprocessor would attempt to read or access data from a selected address location in the ROM. If the "read" was successful, the data retrieved subsequently would be passed back to the tester where a checksum or other signature algorithm would be implemented to attempt to verify that the retrieved data was what was expected. Thereafter another "read" could be made at the next ROM address, and its contents verified. To test the entire boot ROM in this manner to verify correctness or validity of the memory contents was thus a long and arduous task.

SUMMARY OF THE INVENTION

In accordance with the present invention, a memory emulation test system is provided with a method of and system for fast functional testing of memories, such as boot ROMs, in microprocessor-based assemblies.

The emulation test system, or emulative tester, includes its own microprocessor and is connected to a unit under test (UUT) in such a way that it can take control of the UUT microprocessor and send test instructions to the UUT from its own memory. When testing the boot ROMs, the emulative tester electrically switches the boot ROMs on for UUT memory-access cycles to allow the UUT microprocessor to make "read" accesses while executing test instructions from the tester's memory. The emulative tester includes a synchronization circuit which, once testing of the boot ROMs begins, is operated under control of the UUT microprocessor and automatically re-arms itself and generates sync pulses on each and every UUT data access cycle to allow the UUT microprocessor to read every boot ROM memory location and collect data to be computed into a checksum or other signature to be compared with a predetermined signature representative of a correctly functioning and faultless boot ROM. The UUT microprocessor maintains control of the synchronization circuit until all of the boot ROM data is collected. The UUT microprocessor computes a checksum or other signature which is passed back to the tester to be compared with a predetermined signature representing a boot ROM containing correct data and operating without faults.

It is therefore one object of the present invention to provide in a memory emulation test system a method of and system for fast functional testing of memories, such as boot ROMs, in microprocessor-based assemblies.

It is another object of the present invention to provide an emulative test system in which a UUT microprocessor can execute tester instructions and read its own boot ROM at its own rate.

It is a further object of the present invention to verify the contents of a UUT's boot ROMs by allowing the UUT microprocessor to collect data from every ROM location before returning a computed checksum or other signature to a tester connected thereto.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
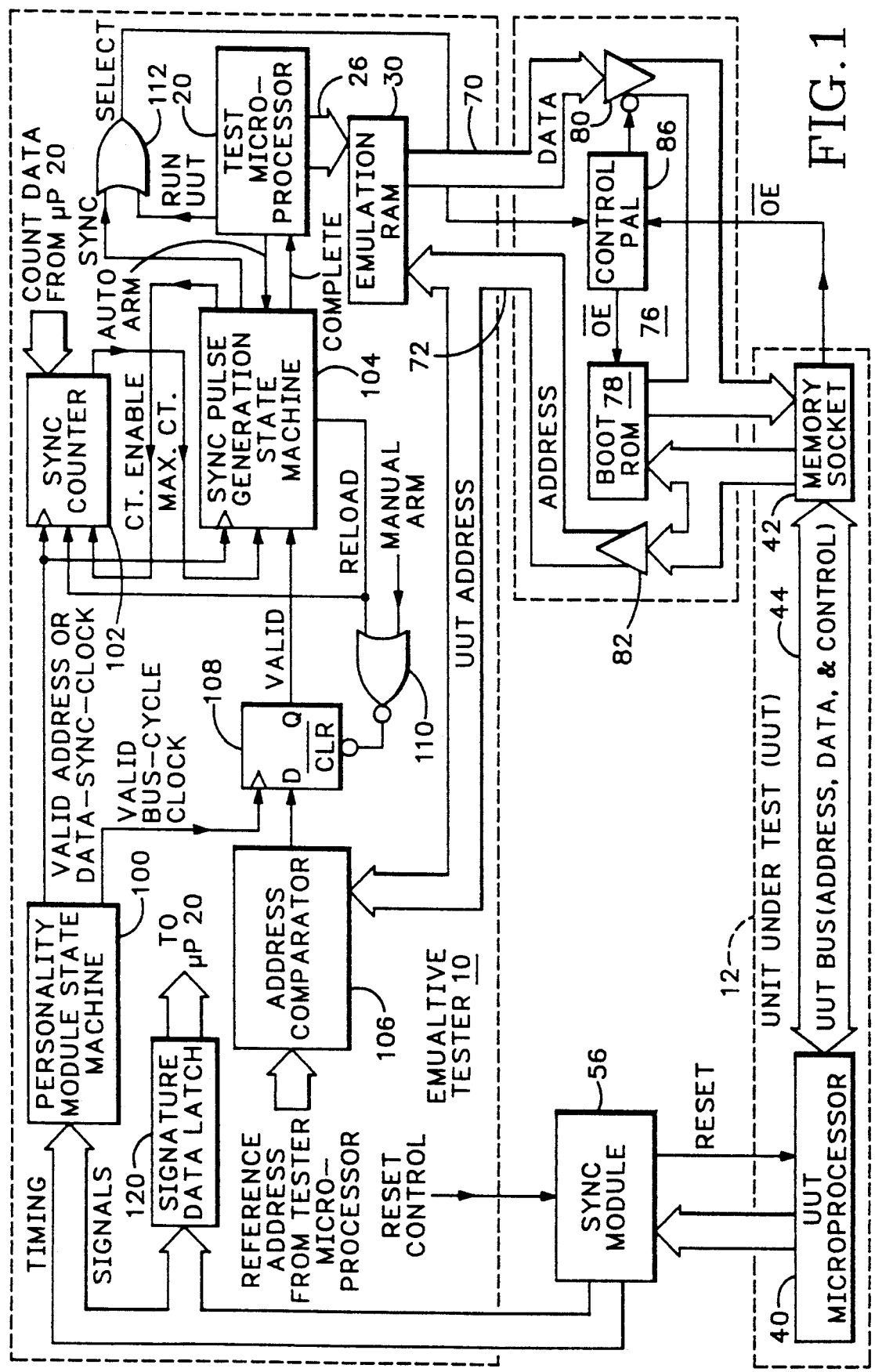
FIG. 1 is a generalized block diagram of an emulative tester connected to a unit under test (UUT) for testing memories in accordance with the present invention.

Referring to FIG. 1 of the drawings, there is shown a generalized block diagram of an emulative tester 10 connected to a unit under test (UUT) 12. The emulative tester 10, which physically may comprise a mainframe unit and an interface pod, includes a microprocessor 20 having its own kernel-related devices, such as a clock, a bus architecture, registers, and memories, which interacts with a keyboard and a display to provide a user-interactive test system. The tester microprocessor 20 is connected via a bus 26 comprising data, address, and control lines to an emulation random-access memory (RAM) 30.

UUT 12 is exemplary of any of a wide variety of microprocessor based systems having boot ROMs whose functionality and operation is to be verified or tested, and includes as the portion of interest a UUT microprocessor 40 connected to its memory socket 42 via a UUT bus 44, which includes address, data, and control buses. For reasons that will become clear shortly, the UUT memory, which includes a boot read-only memory (ROM) section, is removed from its socket.

Interconnection of the tester 10 with UUT 12 includes a sync module 56 to condition timing signals from the UUT microprocessor 40 and to allow tester microprocessor 20 to send reset control signals to UUT microprocessor 40. Timing signals of UUT microprocessor 40, including UUT clock signals, are applied via a sync buffer within sync module 56 to synchronize certain activities in the tester with the UUT, as will be explained in detail below. Tester microprocessor 20, when instructed to do so, sends reset control signals to a reset driver within sync module 56, which in turn generates a reset pulse which is applied to override UUT microprocessor 40's reset system and allowing the tester 10 to gain control of the UUT.

Emulation RAM 30 is connected to memory socket 42 through a cable structure which includes a data bus 70 and an address bus 72. The UUT's memory, which was indicated above as being removed from its socket, is plugged into a socket on a memory module 76, and is shown in FIG. 1 as boot ROM 78. Bidirectional buffers 80 and 82 are interposed in the signal paths of buses 70 and 72, respectively. Thus, either the emulation RAM 30 or the boot ROM 78 may be electrically connected via buses 70 and 72 to the UUT bus 44 for access of data by UUT microprocessor 40. In this configuration, tester microprocessor 20 can select the appropriate memory by means of a control programmable array logic (PAL) device 86, which enables either the data buffer 80 or the boot ROM 78 while disabling the other. Boot ROM 78 is turned on by the chip select line/OE from the UUT.

Emulative tester 10 includes a synchronization circuit which permits the boot ROMs to be read by the UUT microprocessor 40 on each and every "read data" cycle for the purpose of collecting data to be included in a checksum or other signature to be computed to verify validity of information contained in the boot ROMs. The synchronization circuit comprises primarily a personality module state machine 100, a programmable sync counter 102, a sync-pulse generation state machine 104, an address comparator 106, and an address latch 108. All of these devices are connected to and receive operational-instruction inputs from the tester microprocessor 20. After a brief description of the functionality of each component of the synchronization circuit, an operating sequence will be described to provide a complete understanding of the present invention.

Personality module state machine 100 receives timing signals, including UUT clock and bus cycle signals, via sync module 56 from the UUT microprocessor 40. Personality module state machine 100 monitors execution of UUT microprocessor 40, and when bus cycles of interest appear, as determined by a control input from tester microprocessor 20, it issues a VALID ADDRESS or DATA-SYNC-CLOCK signals to programmable sync counter 102 and sync-pulse generation state machine 104, and also issues a VALID BUS-CYCLE CLOCK signal to address latch 108.

Address comparator 106 monitors addresses on address bus 72 as UUT microprocessor 40 addresses boot ROM 78, and compares the UUT addresses with a reference address supplied by tester microprocessor 20. Upon a match of the reference address with a predetermined address received from the UUT via address bus 72 as UUT microprocessor 40 accesses instructions from emulation RAM 30, address comparator 106 issues a VALID compare signal, which is latched on the next VALID-BUS-CYCLE CLOCK signal issued by personality module state machine 100.

Programmable sync counter 102 determines the precise timing of the occurrence of sync pulses generated by the sync pulse generation state machine. It is programmed initially by tester microprocessor 20 with count data defining the number of UUT clock pulses required after a bus cycle at the predetermined address described in the preceding paragraph before a "read data" access of the boot ROM 78 is made. When enabled by a COUNT ENABLE output from sync pulse generation state machine 104, sync counter 102 counts DATA-SYNC-CLOCK pulses from personality module state machine 100, and upon reaching the programmed count value, issues a MAXIMUM COUNT output to the sync pulse generation state machine 104.

Sync pulse generation state machine 104 generates sync pulse outputs which cause the control PAL 86 to dynamically substitute the boot ROM 78 for emulation RAM 30 at the appropriate time when UUT microprocessor is attempting "read data" accesses. When the sync pulse generation state machine receives both a VALID compare input from address latch 108 and a MAXIMUM COUNT input from sync counter 102, a sync pulse will be generated on the next DATA-SYNC-CLOCK pulse from personality module state machine 100. While the sync pulse generation state machine 104 may be manually armed via a negative-output OR-gate 110, which enables the address latch 108 for a single event, an automatic re-arming mode is provided for the boot ROM test. Tester microprocessor 20 activates an AUTO ARM input of sync pulse generation state machine 104, which will remain activated throughout the boot ROM test. Upon generation of each sync pulse during the boot ROM test, sync pulse generation state machine 104 generates a RELOAD output which first clears and then enables address latch 108 and permits the sync counter 102 to be reloaded with count data initially furnished by tester microprocessor 20 and stored in an internal register of sync counter 102. Sync pulse generation state machine 104 may suitably be a programmable logic device (PLD) or a programmable array logic (PAL) programmed to follow the desired sequence of events. In the preferred embodiment, a commercially available 22V10 high-performance logic device was programmed for this function.

The sync pulses generated by sync pulse generation state machine 104 are applied to control PAL 86 via an OR gate 112, which also permits the tester microprocessor to select a "run UUT" mode in which the UUT microprocessor 40 is permitted to execute instructions from its boot ROM 78 at its own clock rate and without interference from the tester.

Figure 2:
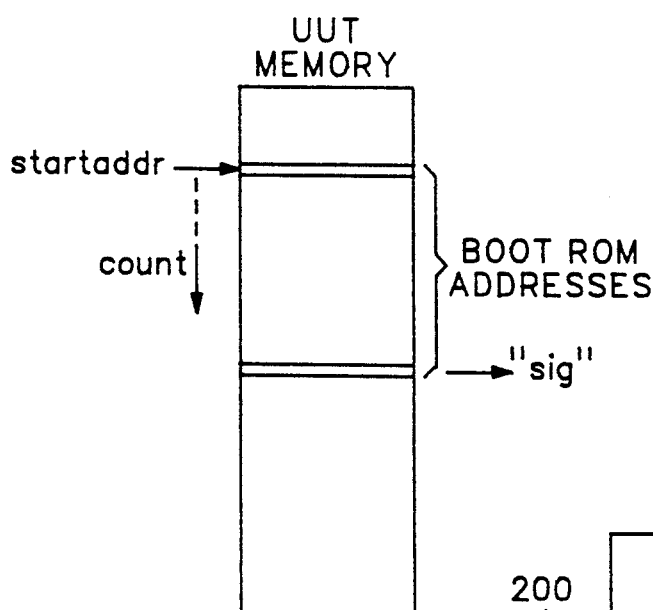
FIG. 2 represents a memory map of the UUT memory, including the space representing boot ROM.

FIG. 2 represents a memory map of the UUT memory, including the space representing boot ROM 78. For this example, assume that the boot ROM has 128K (131,072) address locations to be tested. The UUT microprocessor 40, upon occurrence of a sync pulse that turns boot ROM 78 on, will retrieve whatever data is stored at the start address ("startaddr"). The retrieved data will be in the form of a series of bits, which will be processed to provide a signature to be stored in a UUT register. Each boot ROM location will be addressed in turn, the data contained therein will be processed in a similar manner until all 131,072 locations have been addressed and the data therein processed. The completed signature will be sent back to the tester 10 to be compared with a predetermined signature from a known good boot ROM. The signature data can be passed back to the tester over the address bus 72, or as shown in FIG. 1, it can be passed back via sync module 56 to a signature data latch 120. The processing to develop a signature may be any of a number of well known techniques, such as mathematic processing to develop a checksum or, as in the case of the preferred embodiment herein, a cyclic redundancy check (CRC) to develop a hexadecimal signature.

Figure 3:
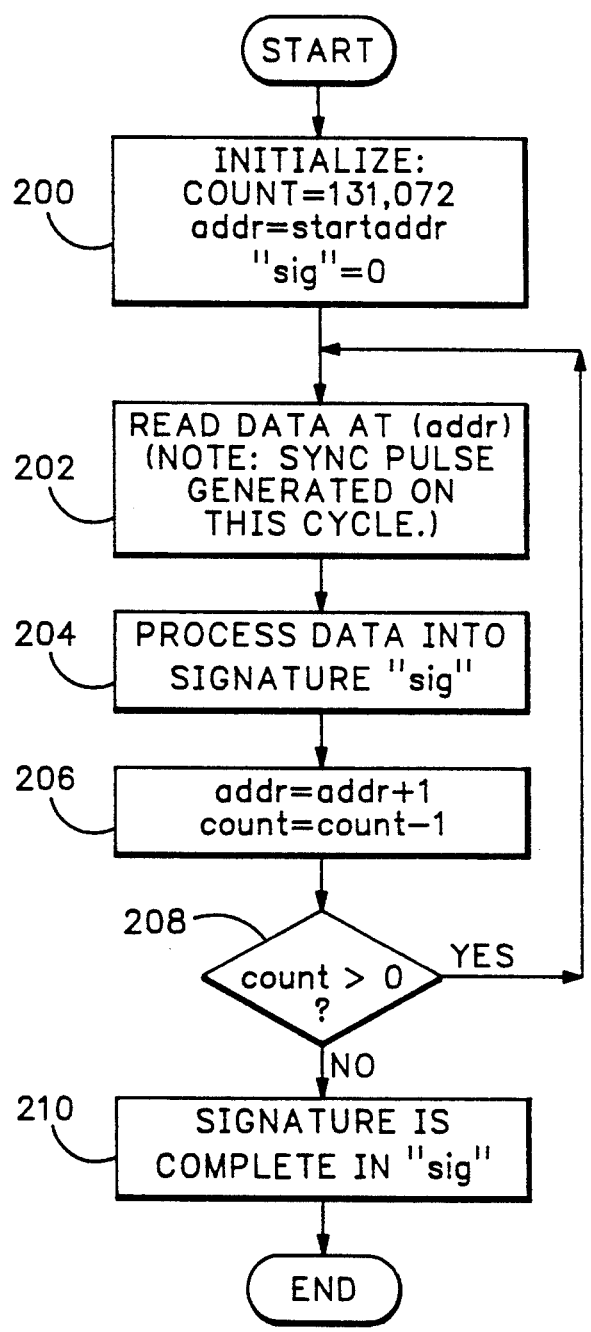
FIG. 3 is a flow chart of instructions stored in the emulation tester's emulation RAM to be executed by the UUT microprocessor.

FIG. 3 is a flow chart of instructions stored in emulation RAM 30 to be executed by UUT microprocessor 40 in developing the signature. Step 200 initializes the count, address, and signature ("sig"). Step 202 instructs UUT microprocessor to retrieve data from a specified address, starting with the start address. During this step, a sync pulse from sync pulse generation state machine 104 causes control PAL 86 to turn on boot ROM 78 long enough for UUT microprocessor 40 to read the data from the specified boot ROM location. Step 204 instructs the UUT microprocessor 40 process the bits retrieved into a signature. Step 206 increments the address pointer to the next address, and decrements the count by one. Step 208 compares the count with zero, and as long as the count is greater than zero, indicating that there are yet unchecked boot ROM locations, instructs UUT microprocessor to loop back to step 202. When the count finally reaches zero, the computed signature is complete in step 210 and subsequently returned to the tester.

To fully understand the boot ROM testing sequence and operation of the synchronization circuit during the testing sequence, consider the following operating sequence. Initially, tester microprocessor 20 loads the boot ROM test instructions into emulation RAM 30, then sets up the synchronization circuit (count data to sync counter 102, reference address to address comparator 106, AUTO ARM to sync pulse generation state machine 104, etc.). It is assumed that the UUT microprocessor 40 has already been verified as operating properly and is capable of executing instructions supplied to the UUT bus from emulation RAM 30. It should be noted that the reference address furnished to address comparator 106 is always the same address throughout a given boot ROM test. It is the address in emulation RAM 30 at which the synchronization circuit is set up to generate a sync pulse to cause boot ROM 78 to be turned on while data from emulation RAM 30 is inhibited. When the program running in the emulation RAM 30 reaches the instruction address that compares with the reference address, a VALID comparison is latched by address latch 108 on the next bus-cycle clock from the personality module 100. When the VALID comparison input is received by the sync pulse generation state machine 104, it issues a COUNT ENABLE signal to the sync counter 102, which in turn counts its predetermined number of DATA-SYNC-CLOCK pulses and generates its MAXIMUM COUNT signal. On the next DATA-SYNC-CLOCK pulse, sync pulse generation state machine generates a SYNC pulse. When the SYNC pulse is generated, the RELOAD output of sync pulse generation state machine 104 goes low, clearing the address register 108, and upon termination of the SYNC pulse, and assuming the AUTO ARM line is still active, the RELOAD line goes high again, enabling the address latch 108 and causing the sync counter 102 to be reloaded with its predetermined count stored in its internal register. The entire re-load cycle takes three UUT microprocessor "read" cycles. Once the testing has started, the operating sequence repeats so that each boot ROM address location can be read in turn, and the synchronization circuit is controlled by the UUT and operates at the UUT's rate. The COMPLETE output from sync pulse generation state machine is activated by each VALID compare input from address latch 108. The COMPLETE output is monitored by tester microprocessor 20 and asynchronously cleared during each cycle, and if COMPLETE is not activated within a predetermined period of time, the tester microprocessor 20 "knows" the boot ROM test is complete, de-activates AUTO ARM, and regains control of the system so that the signature can be processed.

While we have shown and described the preferred embodiments of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. In an emulative test system connectable to a unit under test (UUT) having a UUT microprocessor and a UUT memory having a predetermined signature associated therewith, said emulative test system having an emulation memory capable of being substituted in place of said UUT memory, a system for fast functional testing of said UUT memory, comprising:

means for causing said UUT microprocessor to execute a test program stored in said emulation memory, said test program having at least a series of steps arranged in a loop and performed iteratively;

a synchronization circuit responsive to UUT timing signals from said UUT for generating sync pulses to cause said UUT memory to be electrically substituted for said emulation memory at a predetermined step on each iteration of said loop so that said UUT microprocessor reads data from each of a plurality of addresses of said UUT memory in sequence;

means for processing said data to compute a test result signature; and means for comparing said test result signature with said predetermined signature, wherein said synchronization circuit comprises an address comparator for comparing addresses occurring during said test program with a reference address and generating a valid comparison signal in response thereto, a counter counting a predetermined number of UUT timing signals and generating a count signal in response thereto, and a sync pulse generation state machine responsive to a combination of said valid comparison signal, said count signal, and said UUT timing signals to generate a sync pulse to electrically substitute said UUT memory for said emulation memory.

2. A system in accordance with claim 1 wherein said synchronization circuit is automatically re-armed after each sync pulsed is generated.

* * * * *